(12) United States Patent
Kang et al.

(10) Patent No.: US 12,164,724 B2
(45) Date of Patent: *Dec. 10, 2024

(54) DYNAMIC NOISE SAMPLING FOR UNSPECIFIED DISPLAY NOISE

(71) Applicant: STMicroelectronics Asia Pacific Pte Ltd., Singapore (SG)

(72) Inventors: MooKyung Kang, Seoul (KR); Sang Hoon Jeon, Seoul (KR)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/490,475

(22) Filed: Oct. 19, 2023

(65) Prior Publication Data

US 2024/0045547 A1 Feb. 8, 2024

Related U.S. Application Data

(63) Continuation of application No. 17/659,617, filed on Apr. 18, 2022, now Pat. No. 11,816,288.

(51) Int. Cl.
*G06F 3/041* (2006.01)
*G06F 3/044* (2006.01)

(52) U.S. Cl.
CPC .......... *G06F 3/0418* (2013.01); *G06F 3/0446* (2019.05)

(58) Field of Classification Search
CPC ........ G06F 3/0418; G06F 3/044; G06F 3/041; G06F 3/0446
See application file for complete search history.

(56) References Cited

U.S. PATENT DOCUMENTS

| 8,874,396 | B1 | 10/2014 | Olson et al. |
| 10,338,746 | B1 | 7/2019 | Ningrat et al. |
| 2014/0125623 | A1* | 5/2014 | Atkinson ............ G06F 3/04166 345/174 |
| 2016/0062494 | A1* | 3/2016 | Zuber .................. G06F 3/0418 345/173 |
| 2017/0139501 | A1 | 5/2017 | Dinu |
| 2017/0351368 | A1 | 12/2017 | Agarwal et al. |
| 2019/0220142 | A1* | 7/2019 | Ningrat .................. G06F 3/044 |
| 2020/0278782 | A1* | 9/2020 | Chan ................... G06F 3/04182 |
| 2021/0191562 | A1 | 6/2021 | Han |

* cited by examiner

*Primary Examiner* — Md Saiful A Siddiqui
(74) *Attorney, Agent, or Firm* — Slater Matsil, LLP

(57) ABSTRACT

A method includes: displaying, an image on a display by sequentially displaying a plurality of frames of the image, the plurality of frames including a first frame and second frame; performing a first noise sampling scan at a plurality of frequencies at a first time location within a first frame; determining a first frequency from the plurality of frequencies with the lowest noise; performing a first mutual sensing scan at the first frequency; performing, a second noise sampling scan at the plurality of frequencies at a second time location within a second frame of the plurality of frames, the second time location being a different frame location than the first time location; determining a second frequency from the plurality of frequencies with the lowest noise, the second frequency being different from the first frequency; and performing, a second mutual sensing scan at the second frequency.

20 Claims, 10 Drawing Sheets

--PRIOR ART--

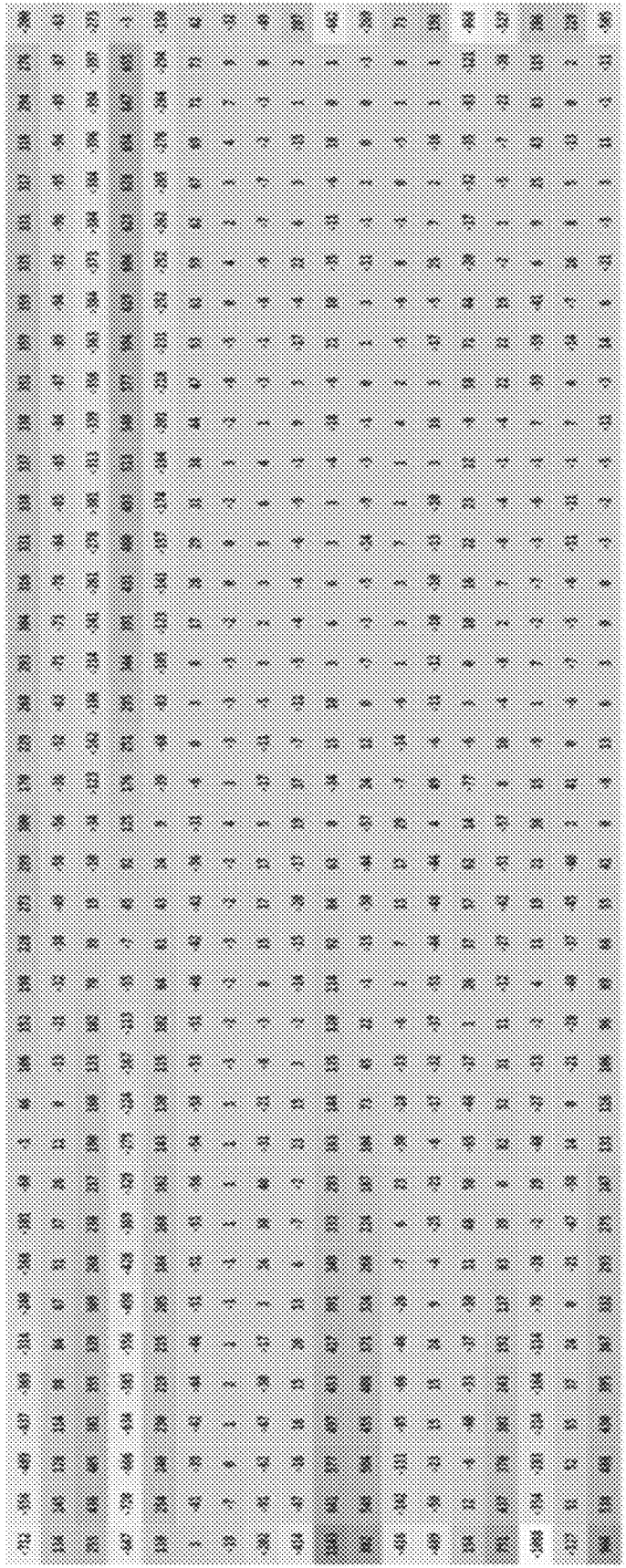
FIG. 2C --PRIOR ART--

DYNAMIC NOISE SAMPLING FOR UNSPECIFIED DISPLAY NOISE

CROSS-REFERENCE TO RELATED APPLICATIONS

This application is a continuation of U.S. application Ser. No. 17/659,617 filed on Apr. 18, 2022, which application is hereby incorporated herein by reference.

TECHNICAL FIELD

The present invention relates generally to systems and methods for operating displays, and in particular embodiments to noise in touchscreen displays.

BACKGROUND

Electronic devices that are designed for user interaction have historically utilized external input devices such as keyboards, key pads, and/or mice to capture user input. In recent years, there has been a push from the more traditional methods, as consumers prefer the convenience of portable devices that can support a more flexible lifestyle. To this end, there has been a rise in smaller, portable, hand-held electronic devices, such as mobile phones, tablets, gaming systems, etc. This has given rise to the popularity of touch screens and touch panel displays as systems for capturing user input. Not only do they provide the functionality of the traditional electronic devices, but touchscreens provide additional features. For example, given the appropriate software, users are able to utilize touchscreens for sketching, drawing, and various hand writing applications.

Organic light emitting diodes (OLEDs) offer a higher performance display. OLED display provide a high contrast self-illuminating display with a low driving voltage and high luminous efficiency. However OLED displays come with their own set of advantages and disadvantages.

A display panel of an OLED based touchscreen may include a plurality of pixels arranged in rows and columns across a display layer in a matrix like formation. Each pixel may include an OLED configured to generate light based on the current driven through it. During operation the touchscreen may be refreshed (e.g. updated) in each of a plurality of display frames defined by a vertical synchronization signal (Vsync). During each display frame each row of pixels is updated sequentially and touch sensing scans (e.g. mutual and self-sensing scans) are performed.

During normal operations, when a color image is being displayed on the touchscreen, Hsync has a strong effect on the display. The typical frequency of noise present on the touchscreen is close to the value of Hsync. If mutual sensing scans used to detect touches made to the touchscreen are performed at the same frequency as the noise of the touchscreen, touches that are not actually occurring may be detected. This is known as a ghost touch. Therefore, the frequency of mutual sensing scans can be configured to be a frequency away from Hsync.

However, when a zebra (black and white) image is displayed on a touchscreen, black areas are areas of low voltages on the touchscreen and white areas are areas of high voltages on the touchscreen. The high and low voltages are dense, and have an effect of the capacitance values sensed by the touchscreen, causing additional noise. Each zebra image have a unique noise frequency it generates. Therefore, mutual sensing scans that are performed when a zebra image is displayed may not avoid the frequency of the zebra image. This may result in a ghost touch.

SUMMARY

In accordance with an embodiment of the present invention, a method for operating an includes: displaying, on a display of the electronic device, an image by sequentially displaying a plurality of frames of the image, the plurality of frames including a first frame and second frame; performing, on the display, a first noise sampling scan at a first time location within a first frame of the plurality of frames, the first noise sampling scan being performed at a plurality of frequencies; determining a first frequency from the plurality of frequencies with the lowest noise based on the first noise sampling scan; performing, on a touchscreen of the electronic device, a first mutual sensing scan at the first frequency; performing, on the display, a second noise sampling scan at a second time location within a second frame of the plurality of frames, the second noise sampling scan being performed at the plurality of frequencies, the second time location being a different frame location than the first time location; determining a second frequency from the plurality of frequencies with the lowest noise based on the second noise sampling scan, the second frequency being different from the first frequency; and performing, on the touchscreen, a second mutual sensing scan at the second frequency.

In accordance with an embodiment of the present invention, a device includes a plurality of pixels; a touchscreen including a touchscreen controller; and a non-transitory memory storing instructions to be executed in the touchscreen controller to configure the touchscreen controller to: displaying, on the display, an image by sequentially displaying a plurality of frames of the image, the plurality of frames including a first frame and second frame; perform, on the display, a first noise sampling scan at a first time location within a first frame of the plurality of frames, the first noise sampling scan being performed at a plurality of frequencies; determine a first frequency from the plurality of frequencies with the lowest noise based on the first noise sampling scan; perform, on the touchscreen, a first mutual sensing scan at the first frequency; perform, on the display, a second noise sampling scan at a second time location within a second frame of the plurality of frames, the second noise sampling scan being performed at the plurality of frequencies, the second time location being a different frame location than the first time location; determine a second frequency from the plurality of frequencies with the lowest noise based on the second noise sampling scan, the second frequency being different from the first frequency; and perform, on the touchscreen, a second mutual sensing scan at the second frequency.

In accordance with an embodiment of the present application, a method for operating an electronic device includes: displaying, on a display layer of a touchscreen, an image by sequentially displaying a plurality of frames of the image; performing, by a touchscreen controller, a plurality of scans on the touchscreen in each of the plurality of frames, each of the plurality of scans including a noise sampling scan performed on the display layer and a mutual sensing scan performed on a touch sensing layer of the touchscreen; determining, in each of the plurality of frames, a first frequency for a subsequent mutual-sensing scan from a plurality of sampling frequencies based on noise levels determined during a previous noise sampling scan; performing the subsequent mutual sensing scan at the first frequency; and changing a sequence of each of the plurality of scans after each of the plurality of frames.

In accordance with an embodiment of the present application, a device includes a display including a display layer including a plurality of pixels; a touchscreen including a touchscreen controller; and a non-transitory memory storing instructions to be executed in the touchscreen controller to configure the touchscreen controller to: display, on the display layer of the touchscreen, an image by sequentially displaying a plurality of frames of the image; perform a plurality of scans on the touchscreen in each of the plurality of frames, each of the plurality of scans including a noise sampling scan performed on the display layer and a mutual sensing scan performed on a touch sensing layer of the touchscreen; determine, in each of the plurality of frames, a first frequency for a subsequent mutual-sensing scan from a plurality of sampling frequencies based on noise levels determined during a previous noise sampling scan; perform the subsequent mutual sensing scan at the first frequency; and change a sequence of each of the plurality of scans after each of the plurality of frames.

In accordance to an embodiment of the present application, a method for operating a touchscreen includes: displaying, on a display layer of a touchscreen, an image by sequentially displaying a plurality of frames of the image; performing, by a touchscreen controller, a plurality of scans on the touchscreen in each of the plurality of frames, each of the plurality of scans including a noise sampling scan performed on the display layer and a mutual sensing scan performed on a touch sensing layer of the touchscreen, the noise sampling scan being performed at a plurality of different noise sampling frequencies, and a start time of the noise sampling scan in each of the plurality of frames being determined based on a frame count of the frame being displayed within the plurality of frames; determining, based on the noise sampling scan for each frame, a noise sampling frequency from amongst the plurality of different noise sampling frequencies having a lowest noise level for that frame; and performing, a mutual sensing scan that is performed subsequent to the noise sampling scan at the noise sampling frequency having the lowest noise level.

In accordance with an embodiment of the present application, a device includes: a display including a display layer including a plurality of pixels; a touchscreen including a touchscreen controller; and a non-transitory memory storing instructions to be executed in the touchscreen controller to configure the touchscreen controller to: display, on a display layer of the touchscreen, an image by sequentially displaying a plurality of frames of the image; perform a plurality of scans on the touchscreen in each of the plurality of frames, each of the plurality of scans including a noise sampling scan performed on the display layer and a mutual sensing scan performed on a touch sensing layer of the touchscreen, the noise sampling scan being performed at a plurality of different noise sampling frequencies, and a start time of the noise sampling scan in each of the plurality of frames being determined based on a frame count of the frame being displayed within the plurality of frames; determine, based on the noise sampling scan for each frame, a noise sampling frequency from amongst the plurality of different noise sampling frequencies having a lowest noise level for that frame; and perform, a mutual sensing scan that is performed subsequent to the noise sampling scan at the noise sampling frequency having the lowest noise level.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate an electronic device according to an embodiment of the present application, wherein FIG. 1A illustrates a component schematic of the electronic device, FIG. 1B illustrates a component schematic of a display of the electronic device, FIG. 1C illustrates a component schematic of a display stack up of the electronic device, and FIG. 1D illustrates a component schematic of a touchscreen of the electronic device;

FIGS. 2A-2C illustrate schematic views of how a conventional electronic device prevents ghost touches using a noise sampling scan, where FIG. 2A illustrates a schematic view of an conventional electronic device preventing ghost touches, FIG. 2B illustrates a graphical representation of a noise sampling scan, and FIG. 2C illustrates a exemplary electronic readout of mutual sensing values when the electronic device is displaying a zebra image and a touch is not occurring on the display;

FIGS. 3A-3B illustrate schematic views of an electronic device preventing ghost touches using two different rotating sequences of sensing scans, wherein FIG. 3A illustrates a schematic view of an electronic device preventing ghost touches using two different rotating sequences of sensing scans, and FIG. 3B illustrates an exemplary readout of mutual sensing values detected by the electronic device when a zebra image is being displayed and a touch is not occurring on the display of the electronic device;

DETAILED DESCRIPTION OF ILLUSTRATIVE EMBODIMENTS

Figure 1A:
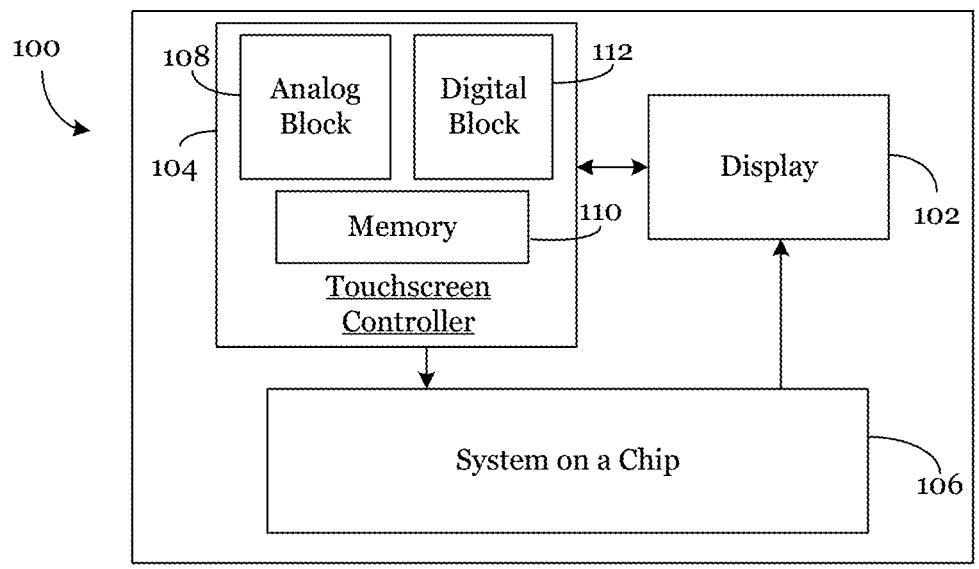

Conventional organic light emitting diode (OLED) devices may include a display panel that may include a plurality of pixels arranged in rows and columns across a display layer in a matrix like formation. During operation, the OLED display may be refreshed in each of a plurality of frames distinguished by a frequency of a vertical synchronization signal (Vsync). The OLED display may be updated by refreshing each row of pixels sequentially from top to bottom of the display in each frame in accordance with a horizontal synchronization signal (Hsync).

A mutual sensing scan is performed on a touchscreen of an OLED display to determine user touch. The sensitivity of the mutual sensing scan depends on various noise sources. If the background noise is high, the sensitivity of mutual sensing will be lower because the touch has to introduce a significant change in mutual capacitance that is above the detection limit. Typically, mutual sensing can be performed over a range of frequencies. However, in practice, the noise levels can be different at different scan frequencies used for mutual sensing. The exact frequency with the lowest noise level can not be determined apriori.

If significant noise is present when the mutual sensing scan is performed, the results of the mutual sensing may detect erroneous touch unless the sensitivity of the mutual sensing is reduced significantly by increasing the detection limit. In other words, a touch on the touchscreen may be detected when nothing is touching the touchscreen. This is known as a ghost touch. During normal operations, when a color image is being displayed on the touchscreen, the horizontal synchronization signal (Hsync) has a strong effect on the display. The typical frequency of noise present on the touchscreen is close to the value of Hsync. If mutual sensing scans used to detect touches made to the touchscreen are performed at the same frequency as the noise of the touchscreen, ghost touches may occur.

Conventionally, to prevent ghost touches when displaying a zebra image (any pattern of black and white), a noise sampling scan may be performed in each of the plurality of frames. Noise sensing scans are usually performed between a self-sensing scan and a mutual sensing scan in each frame. During the noise sampling scan, noise levels on the display corresponding to each frequency from a plurality of frequencies is detected. Due to the duration of the frame, the duration of a self-sensing scan, and a duration of the mutual sensing scan, the noise sampling scan is performed for a limited amount of time of the display. Also because the display is being updated row-by-row, the noise sampling scan is performed on only the portion of the touchscreen that is being updated during the noise sampling scan.

However, zebra (black and white) images on the touchscreen include high voltage areas on the display where white is displayed and low voltage areas on the display where black is being displayed. This contrasting array of voltages is packed within a small area and can cause changes to the capacitances sensed on the touchscreen. In addition, the noise from such zebra images varies with frequency. Therefore, to minimize the noise generated from the zebra image, the frequency with the lowest noise value in the noise sampling scan is selected and the subsequent mutual sensing scan is performed at the selected frequency. This is known as frequency hopping.

However, in some cases, only a portion of the image being displayed contains a zebra pattern. For example, the portion of the display or frame in which the noise sampling scan is being performed may not have a zebra pattern while the rest of the portion being displayed may contain a zebra pattern. In such cases, the noise sampling scan does not detect the zebra pattern and therefore the system is unaware of the associated higher noise. The display may thus select a frequency that is inappropriate for the zebra pattern. Consequently, the noise associated with the zebra pattern, i.e., the zebra pattern noise may cause a false detection and result in ghost touch.

Embodiments relate to dynamic noise sampling for unspecified display noise. Embodiments of the present application disclose a method for rotating the start time of noise sampling scans frames to prevent a ghost touch. In other words, the portion of the display that is scanned during a noise sampling scan changes between frames, increasing coverage of noise sampling scans across the display.

Figure 1B:
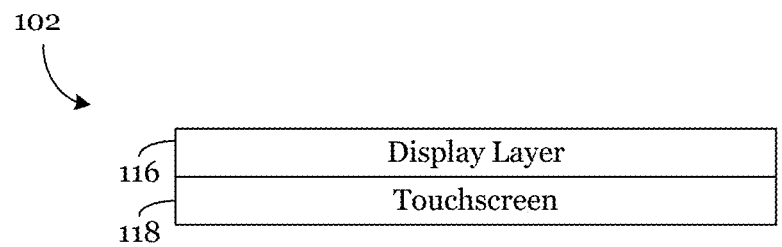
Figure 1C:
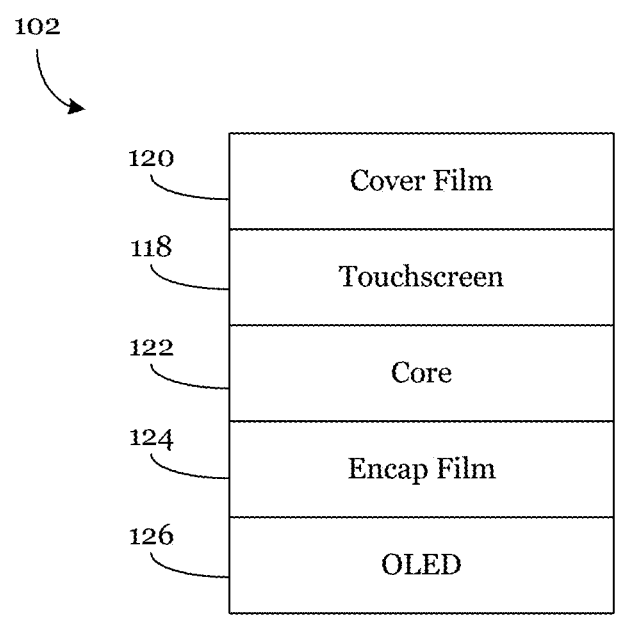
Figure 1D:
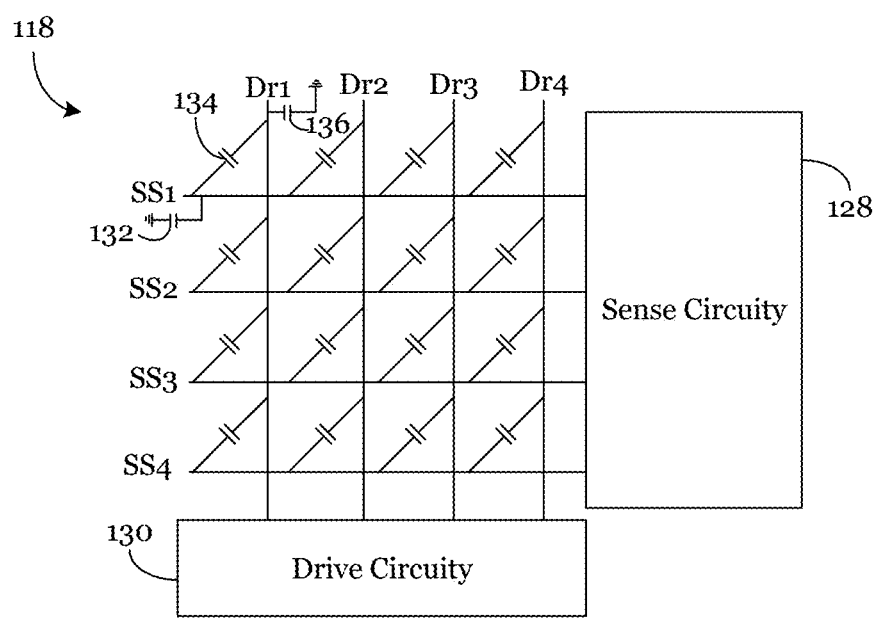

FIGS. 1A-1D illustrate an electronic device according to an embodiment of the present application, wherein FIG. 1A illustrates a component schematic of the electronic device, FIG. 1B illustrates a component schematic of a display of the electronic device, FIG. 1C illustrates a component schematic of a display stack up of the electronic device, and FIG. 1D illustrates a component schematic of a touchscreen of the electronic device.

Referring to FIG. 1A, an electronic device wo may include a display 102, a touchscreen controller 104, and a system on a chip 106. The electronic device boo may be a smart phone, a GPS device, a tablet computer, a mobile media player, a laptop, a gaming system, a personal computer, or any other electronic device that may utilize touch sensitive display.

The display 102 may be an organic light emitting diode (OLED) display, an LED display, or any other type of display. The display 102 may include a plurality of pixels in a display layer configured to display an image. As understood by those with ordinary skill in the art, the display layer of the display 102 may include of the plurality of pixels positioned at each of the intersections between the data lines and scan lines. The plurality of scan lines may extend across the rows of the display 102, and data lines that extend across the columns of the display 102 in a matrix like formation.

The display may also include a touchscreen (e.g. a touch sensing layer) configured to detect touches made on the display 102. This will be shown in more detail below.

The touchscreen controller 104 may perform various methods with respect to the display. In various embodiments, the touchscreen controller 104 may be a processor that analyzes information and carries out a series of executable scripts, e.g., stored in a memory no. In one or more embodiments, the processor may comprise an application-specific integrated circuit (ASIC) device, a central processing unit (CPU), or any other processing unit known in the art. In various embodiments, the touchscreen controller 104 may comprise a number of separate computing units such as cores integrated within one processor, or distinct separate processing chips.

In various embodiments, the touchscreen controller 104 may include, an analog block 108, a digital block 112. The analog block 108 may include a plurality of analog circuits configured to measure capacitances across display 102 and convert them into digital values. The digital block 112 may comprise a variety of digital logic circuits such as DACs or digital control systems configured to obtain digital touch data from the analog block 108, process the digital touch data and store them into memory no.

The memory no may be programmed for short term and/or long term memory storage. The memory no may comprise various programs to be executed in the touchscreen controller 104. The memory no may include both volatile and non-volatile memories. The memory 110 is designed to retain information generated by the touchscreen controller 104 so it can be recalled at a later time.

In various embodiments, the system on a chip 106, may also be known as an application processor, and may comprise a processor, interface, circuitry, and/or the like configured to direct the flow of input and output data to the display 102 and the associated touchscreen controller. The system on a chip 106 may be configured to transmit image data and synchronization signals to the touchscreen controller 104. In other words, the system on a chip 106 may be configured to transmit image data corresponding to a plurality of frames on an image.

In various embodiments, the synchronization signals transmitted by the system on a chip 106 may include a horizontal synchronization signal (Hsync) and a vertical synchronization signal (Vsync). The touchscreen controller 104 may receive the image data and transmit processed image data to the pixels on the display 102 based on Hsync and update the image displayed based on Vsync. In other words, each time Vsync is transmitted, the frame of an image currently being displayed may be refreshed to the next frame of the image.

As understood by those with ordinary skill in the art, the frame of the image being displayed may be refreshed (e.g. updated) in each of a plurality of display frames defined by Vsync. When Vsync is transmitted (i.e. logic high), the frame of the image being displayed may be refreshed. Therefore, the frequency of Vsync distinguishes each of the frames.

During each of the frames, the touchscreen controller 104 may update each row of pixel circuits sequentially in accordance with Hsync. The touchscreen controller 104 may update each row of pixels of the display top-to-bottom in accordance with Hsync is each frame. In other words a different row of pixels may be updated each time Hsync is transmitted (i.e. is logic high). Therefore, Hsync has a higher frequency than Vsync.

Additionally, the touchscreen controller 104 may be configured to detect touches on the display 102 via a touchscreen. In other words, the touchscreen controller 104 may be configured to send touch driving signals (TDS) to the touchscreen, receive touch sensing signals (TSS) in return from the touchscreen, process the TSS to determine coordinates of touch, and report them to the system on a chip 106. Then based on the touch data collected from scanning, the touchscreen may be used by the touchscreen controller 104 to determine the coordinates of touch, and report them to the system on a chip 106. Then, the system on a chip 106 may provide an output to the display 102 based on the reported coordinates of touch.

As understood by those with ordinary skill in the art, when noise is present on the display 102, if a mutual sensing scan is performed at the same frequency as the noise, the mutual sensing scan may detect a ghost touch on the display 102.

Typically noise may be generated on the display 102 based on the brightness of the colors being generated by each pixel. The brighter the color of a pixel the higher the voltage. In normal operation, when color images are being displayed on the touchscreen, the high frequency of Hsync has a strong effect on the noise on the display. In other words, the frequency of the noise on the touchscreen typically follows Hsync. Therefore, the frequency of the mutual sensing scans can be configured to avoid Hsync.

However, when zebra (black and white) patterns are displayed, an increase in the variation between high voltages in white areas and the low voltages in the black areas generate additional noise. Each zebra image may generate noise on the display 102 that peaks at a frequency different than the frequency of Hsync and may not be easily avoided by the frequency used in mutual sensing scans.

Conventionally, to avoid performing mutual sensing scans at the frequency at which the noise has a maxima (or generally high), noise sampling scans are performed in each frame. Noise sampling scans are conventionally performed once in each frame along with a self-sensing scan and a mutual sensing scan. In order to have enough time to perform each of the scans, the noise sampling scan is performed during a portion of each frame.

Noise sampling scans are conventionally performed over a plurality of different frequencies. This allows a noise level to be determined for each different frequency. Then the frequency having the lowest noise value may be used as the frequency for performing a mutual sensing scan. This allows the mutual sensing scan to be changed so as to be performed at a different frequency than the frequency of the peak noise caused by the zebra pattern.

Because the display 102 is being updated row by row, and due to time constraints, a noise sampling scan can only be performed over a portion of the display 102. Conventionally noise sampling scans are performed at a same start time in each frame and over a same portion of the display 102.

The inventors of this application have identified that in instances where the portion of the display 102 being scanned does not indicate a zebra pattern is being displayed, frequency hopping will not occur. For example, if an image with zebra pattern is being displayed but the portion of the display that is scanned is only a white (or black) portion of the display, the noise levels of the image may be miscalculated. In other words, in each noise sampling scan, due to the small noise values generated by the all white (or all black) portion of the image, the touchscreen controller would be misguided to perform the mutual sensing scan at a frequency with a higher noise. This may result in ghost touch.

Advantageously embodiments of the present application disclose a method for rotating the start time of noise sampling scans between each frame to prevent a ghost touch. In other words, the portion of the display that is scanned during a noise sampling scan changes between frames, increasing the coverage of noise sampling scans.

FIG. 1B illustrates a schematic of the display. In various embodiments, the display 102 may include a touchscreen 118 (e.g. a touch sensing layer) and a display layer 116. The touchscreen 118 and the display layer 116 may be situated on the front facing side of the electronic device 100.

FIG. 1C illustrates a display stack-up of the display 102. The display stack-up of the display 102 may include a plurality of layers. In various embodiments, the display 102 may comprise a cover film 120, the touchscreen 118, a core 122, an encapsulation film 124, and an OLED layer 126.

The OLED layer 126 may comprise a plurality of OLED elements (e.g., pixels) formed across rows and columns of the touchscreen in a matrix like formation. The OLED elements may be configured to transmit light having a color (such as red, green, or blue) with a brightness based on the current they are driven with to display each of the frames of the image. As described above, the color and brightness displays by OLED elements are refreshed in display frames according to a vertical synchronization signal (Vsync) and a horizontal synchronization signal (Vsync).

The encapsulation film 124 may be formed and in direct contact with the OLED layer 126. The encapsulation film 124 may function to prevent oxygen, water, or moisture from external sources reaching into and damaging the OLED layer 126. The encapsulation film 124 may comprise one or more layers of material. For example, the encapsulation film 124 may comprise silicon dioxide, silicon nitride, or any other encapsulation films known in the art.

A core 122 may be formed over the encapsulation film 124. The core 122 may be used for controlling the characteristics of the display 102 such as external light reflection, color accuracy, luminance, and so on. For example, the core 122 may include multiple layers such as a reflection control layer that includes color filters, a lens layer corresponding to each OLED element of the OLED layer, and the like.

The touchscreen 118 may be formed over the core 122. The touchscreen 118 may be a capacitive touch panel configured to detect touches made to the display 102. This will be explained in more detail below. Nevertheless, it should be clear that noise generated at the OLED layer 126 can be picked up at the touchscreen 118.

The cover film 114 may be a protective layer to protect the touchscreen 118. The cover film 114 may comprise a transparent material such as a thin layer of glass including silicon dioxide.

The display stack-up described in FIG. 1C is for example purposes only and is not limited by this application. Additional layers known in the art may also be included in the display stack up of the display 102.

FIG. 1D illustrates a schematic of the touchscreen 118. In various embodiments, the touchscreen 118 may comprise drive lines Dr1-Dr4 and sense lines SS1-SS4 that span the entirety of the touchscreen 118 in a grid-like fashion that are operable by the touchscreen controller 104. In various embodiments, the drive lines Dr1-Dr4 may be formed in rows across the touchscreen 118 and the sense lines SS1-SS4 may be formed in columns across the touchscreen 118. In other embodiments, the drive lines Dr1-Dr4 may be formed in columns across the touchscreen 118 and sense lines SS1-SS4 may be formed in columns across the touchscreen 118. In various embodiments, the number of drive lines may be equal to the number of sense lines. Although four drive lines and four sense lines are illustrated in FIG. 1D, this is not indicative of the number of drive and sense lines that may be present on the touch sensing layer. The number of drive and sense lines used are not limited by this application.

The drive lines Dr1-Dr4 and the sense lines SS1-SS4 may overlap in certain embodiments. While FIG. 1F depicts the drive lines Dr1-Dr4 and the sense lines SS1-SS4 overlapping in an orthogonal manner, they may overlap other than orthogonally such as being interleaved or at various angles.

The drive lines Dr1-Dr4 and the sense lines SS1-SS4 may have a measurable mutual capacitance at their intersections as to form a matrix of mutual capacitors with mutual capacitances 134.

In various embodiments, the drive lines Dr1-Dr4 may be coupled to drive circuitry 130 and the sense lines SS1-SS4 may be coupled to sense circuitry 128 of the touchscreen controller 104. As appreciated by those with ordinary skill in the art, each of the drive lines and the sense lines may also have a self-capacitance 136 that is measurable. In other words, the drive lines Dr1-Dr4 and the sense lines SS1-SS4 are operable in mutual sensing mode and a self-sensing mode.

Figure 2A:
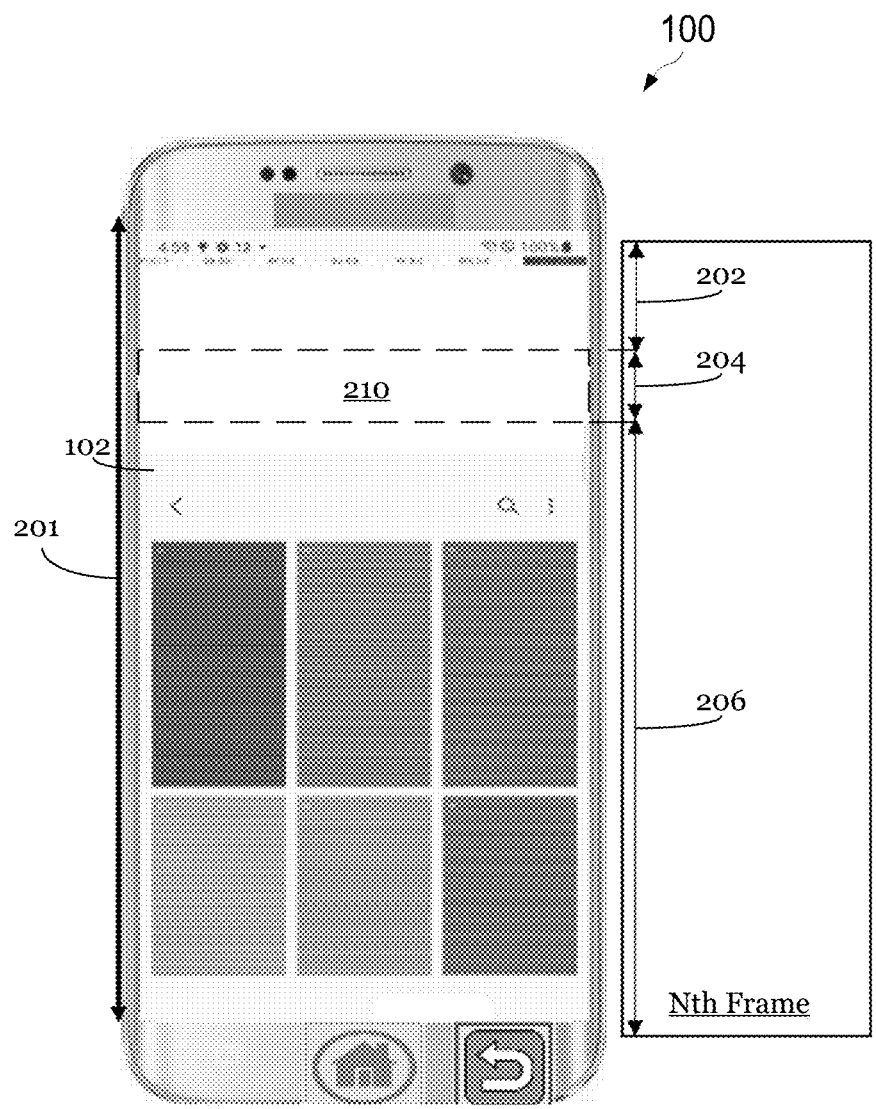
Figure 2B:
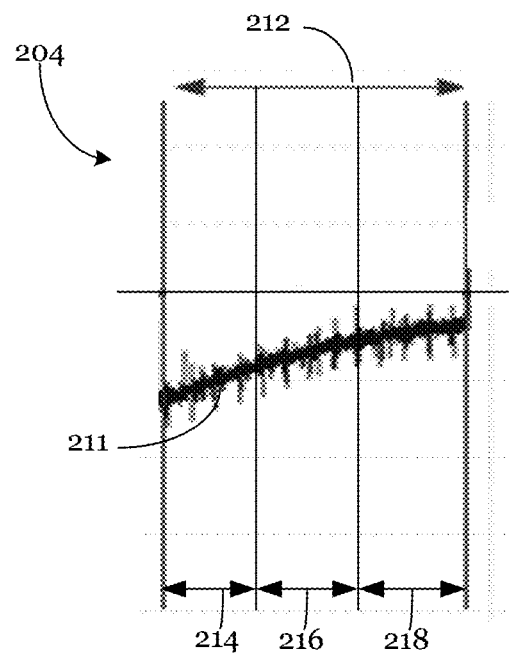

FIGS. 2A-2C illustrate schematic views of a conventional electronic device to prevent ghost touches using a noise sampling scan, where FIG. 2A illustrates a schematic view of an conventional electronic device preventing ghost touches, FIG. 2B illustrates a graphical representation of a noise sampling scan, and FIG. 2C illustrates a exemplary electronic readout of mutual sensing values when the electronic device is displaying a zebra image and a touch is not occurring on the display.

Referring to FIG. 2A, conventionally, an electronic device 100 performs a self-sensing scan 202, a noise sampling scan 204, and a mutual sensing scan 206 within a duration of a frame 201.

Each of the scans is performed in the following order in each of the displays frames: the self-sensing scan 202, the noise sampling scan 204, and then the mutual sensing scan 206. Each of the scans is always performed at the same position in each of the frames.

As described above, because the noise sampling scan 204 is performed at the same position in each frame, a same portion 210 of the display 102 may be scanned in each frame. In other words, in FIG. 2A even though a zebra image is being displayed, the portion 210 of the display 102 being scanned in each frame is only displaying white.

Referring to FIG. 2B, the noise sampling scan 204 may be performed at a plurality of frequencies. For example, the noise sampling scan 204 may be performed at a first frequency during a first duration 214, a second frequency during a second duration 216, and a third frequency during a third duration 218. The first duration 214, the second duration 216, and the third duration are each shorter than a duration of the noise sampling scan 212.

The noise level between pixels of the display 102 within the portion 210 of the display 102 may be sampled at each frequency. Then the frequency having the lowest noise level may be selected, and the mutual sensing scan 206 in the frame 201 may be performed at that frequency.

As understood by those with ordinary skill in the art, when noise is present on the display 102, if a mutual sensing scan is performed at the same frequency as the noise, the mutual sensing scan may detect a ghost touch on the display 102. The inventors of this application have identified that if a zebra pattern is being displayed, but the portion 210 of the display 102 being sampled is only showing white (or black) (i.e., does not include the zebra pattern), the frequency selected by the noise sampling scan 204 may not avoid the frequency of the noise caused by a zebra pattern. Because the same portion 210 of the display 102 is being scanned during the noise sampling scan that is only displaying white, the zebra pattern in the image will never be detected and the mutual sensing scan will sense ghost touches.

Referring to FIG. 2C, readout 222 may be generated by the touchscreen controller 104 when such a zebra pattern image is being displayed and a touch is not occurring on the display 102. When a touch is not being made on the display 102, the mutual sensing values should be close to zero. However, due to the noise of the zebra pattern image and because the same portion 210 (all white portion) of the display 102 was scanned in each noise sampling scan, the mutual sensing values may be indicative of the additional capacitances (noise) sensed from the zebra pattern image. In other words, the magnitudes of the mutual sensing values indicate changes in capacitances that are not due to a touch, but because the touchscreen is unaware of this noise, a touch is reported to the system on a chip 106.

Advantageously, to prevent the occurrence of ghost touches, embodiments of the present application rotate the time location of the noise sampling scan between frames. One advantage of this is that noise sampling scans will be performed on different portions of the display, allowing for a zebra image to be detected and frequency hopping to take place preventing ghost touches.

Figure 3A:
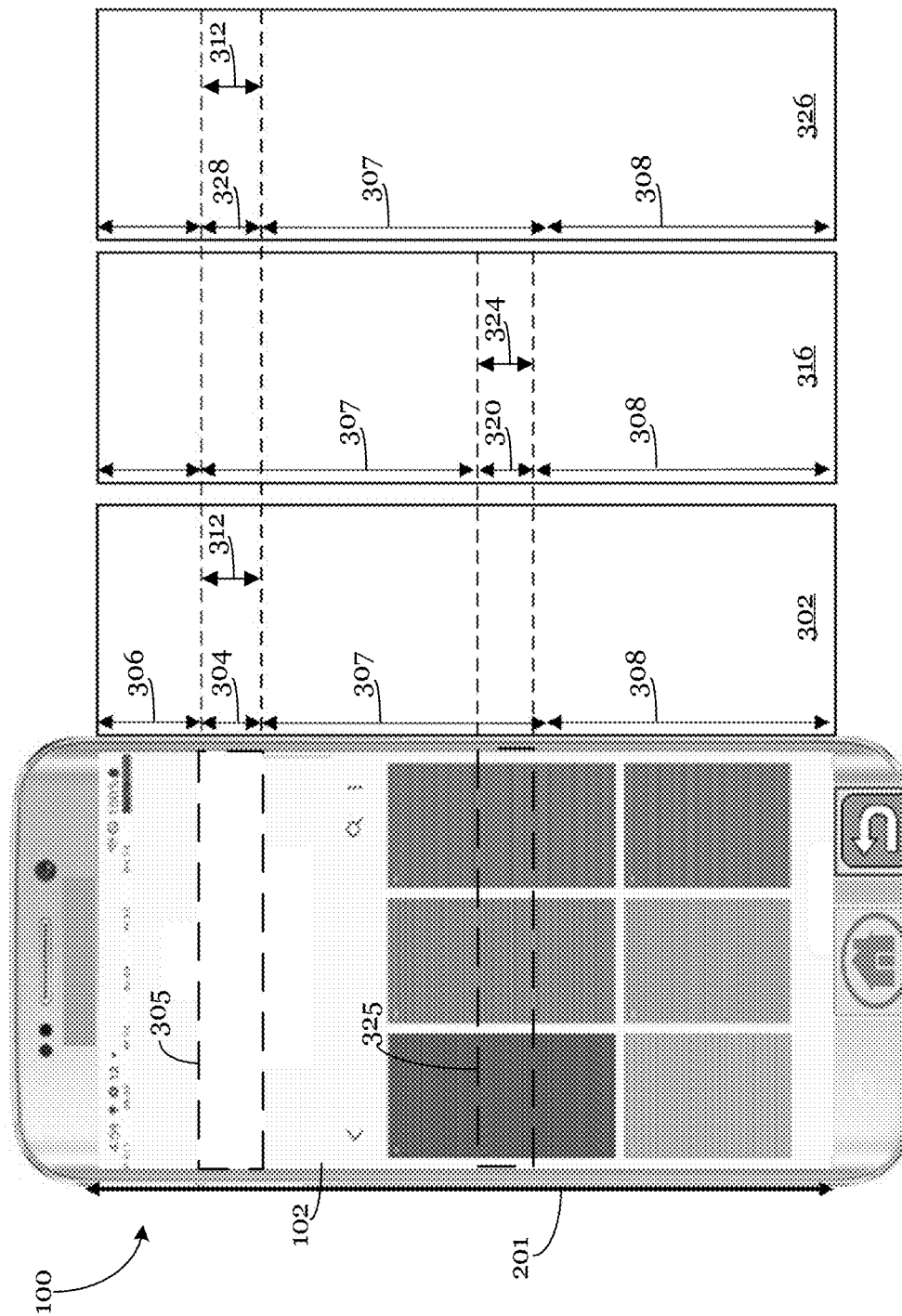
Figure 3B:
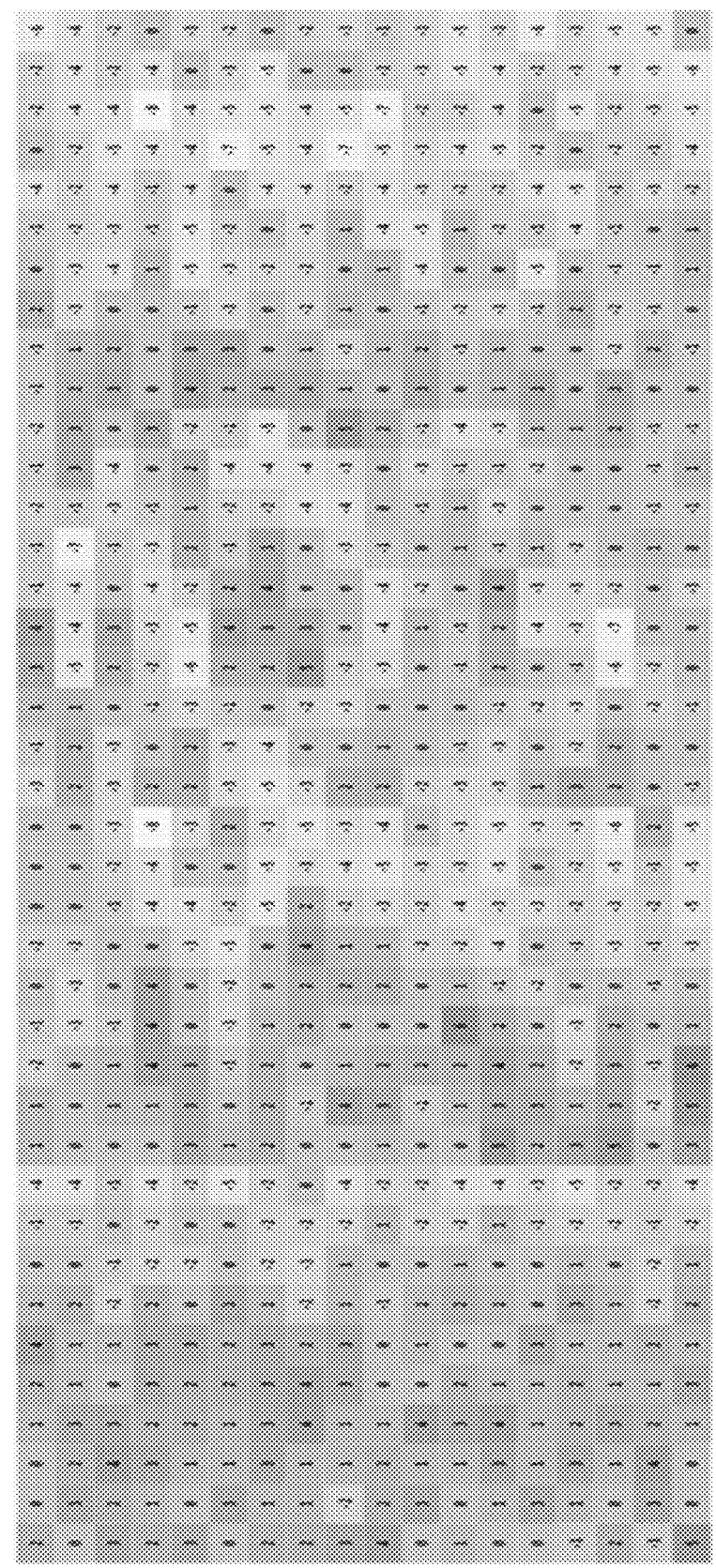

FIGS. 3A-3B illustrate schematic views of an electronic device preventing ghost touches using two different rotating sequences of sensing scans, wherein FIG. 3A illustrates a schematic view of an electronic device preventing ghost touches using two different rotating sequences of sensing scans, and FIG. 3B illustrates an exemplary readout of mutual sensing values detected by the electronic device when a zebra image is being displayed and a touch is not occurring on the display of the electronic device.

Referring to FIG. 3A, in each of a plurality of frames, a noise sampling scan, a self-sensing scan, and two mutual sensing scans may each be performed during a duration of a frame 201. In other words, each mutual sensing scan may be divided into two mutual sensing scans.

In each frame, the scans may be performed in rotating sequences. In other words, noise sampling scans may be performed at rotating time locations within the duration 201 of a frame. Advantageously, because each mutual sensing scan may be divided into two mutual sensing scans, each of the scans may be performed in multiple rotating sequences. Also dividing mutual sensing scans allows for fast frequency hopping because two different mutual sensing scans in a same frame may be performed at different frequencies.

FIG. 3A illustrates an embodiment in which the scans are performed in a two frame rotation.

A first sequence, defined as order number zero may be as follows: a self-sensing scan 306, a first noise sampling scan 304, and a first mutual sensing scan 307, and a second mutual sensing scan 308. A second sequence defined as order number one may be as follows: a self-sensing scan, a first mutual sensing scan 307, a second noise sampling scan 320, and then a second mutual sensing scan 308. These two sequences are used for example purposes only. Any two sequences of the scans may be used.

In this illustrative embodiment, for each frame, a specific sequence is selected between the first sequence and the second sequence. The sequence of the scans used in each frame may be determined based on a current frame count, the order numbers of the sequences, and the number of sequences to be used, which is two in this example embodiment. The specific sequence to be used in a frame may be determined by determining the modulus of the current frame count with the number of sequences to be used, i.e., current frame count mod number of sequences. The sequence corresponding to the order number that is equal to the current frame count mod number of sequences is selected to be the sequence for that frame.

Referring back to FIG. 3A, at a first frame 302, the current frame count is zero. The modulus between zero and two is equal to zero. Therefore the first sequence (order number zero) is used in the first frame 302.

Each of the scans may be performed according to the first sequence in the first frame 302. In other words, the sequence of the scans in the first frame 302 may be as follows: a self-sensing scan 306, a first noise sampling scan 304, a first mutual sensing scan 307, and then a second mutual sensing scan 308. The first noise sampling scan 304 may be performed at a first time location 312 of the first frame 302.

The first noise sampling scan 304 may be performed in the same manner described above. Because the display 102 is being updated row by row starting at the beginning of each frame, and because the time of the noise sampling scans are time-constrained so that each scan can be performed in a single frame, noise sampling scans can only be performed over a portion of the display 102. In other words, the noise sampling scans may be performed while the display 102 is being refreshed. Therefore, the first noise sampling scan 304 may be performed over a first portion 305 of the display 102 at a plurality of frequencies. The first portion 305 is the portion of the display being updated during the first time location 312.

As explained above, during each noise sampling scan, a noise level across a portion of the display 102 is determined at different frequencies. The frequency with the lowest noise level is selected and a subsequent mutual sensing scan is performed at (e.g. after frequency hopping) to the selected frequency. In various embodiments, because noise sampling scans are not necessarily performed before each mutual sensing scan in each frame, the frequency determined from a prior noise sampling scan may be used in each subsequent mutual sensing scan until a next noise sampling scan is performed.

During the first noise sampling scan 304, a noise level of the first portion 305 may be determined for each of the plurality of frequencies. The frequency having the lowest noise level may be selected as a first frequency. Then the first mutual sensing scan 307, and the second mutual sensing scan 308 of the first frame 302 may be performed at the first frequency.

In various embodiments, during the mutual sensing scans, the touchscreen controller 104 may determine each of the mutual capacitances 134 at each intersection of a sense line and a drive line and convert mutual capacitances 134 to digital values. The digital values are known as mutual sensing values. Then based on the mutual sensing values, the touchscreen controller 104 may determine coordinates of a touch on the touchscreen 118 (if any) for the first frame 302. Because two mutual sensing scans are performed in the first frame 302, the mutual sensing values of the first mutual sensing scan 307 and the second mutual sensing scan 308 of the first frame 302 may be averaged to determine the mutual sensing values determined in the first frame 302.

However, as described above, if an image with zebra pattern (simply a zebra image) is being displayed, there is a possibility that the first portion 305 may only be displaying all white (or all black). In this case, the frequency of the noise is indicative of an all-white image with little noise and not a zebra image. Therefore, if the first portion 305 of the display is scanned in the noise sampling scan in each frame, the frequencies selected in each frame may be not be able to hop to avoid performing a mutual sensing scan at the frequency of the zebra image.

Advantageously, as described above, the time location of the noise sampling scan may be rotated between frames so that a different portion of the display 102 is scanned in a subsequent noise sampling scan.

After the first frame 302, the current frame count is one. The modulus between one and two is one. Therefore, the second sequence (order one) is used in a second frame 316.

The order of scans in the second frame 316 may be as follows: a self-sensing scan 306, a first mutual sensing scan 307, a second noise sampling scan 320, and then a second mutual sensing scan 308.

Due to the change in order of the scans, the second noise sampling scan 320 may be performed at a second time location 324. Because the second noise sampling scan 320 is performed after the first mutual sensing scan 307 in the second frame 316, the second time location 324 may occur after the first time location 312.

Therefore, the second noise sampling scan 320 may scan a second portion 325 of the display 102 to determine a second frequency.

As described above, because the first mutual sensing scan 307 in the second frame 316 is performed prior to the second noise sampling scan 320, it may be performed at the first frequency. On the other hand, because the second mutual sensing scan 308 of the second frame 316 occurs after the second noise sampling scan 320, it may be performed at the second frequency.

In various embodiments, a rolling average of each of the mutual sensing values determined from each mutual sensing scan may be kept. In other words, coordinates of a touch (if any) in the second frame 316 may be determined by taking the average of the mutual sensing values determined from the first mutual sensing scan 307 in the first frame 302, the second mutual sensing scan 308 in the first frame 302, the first mutual sensing scan 307 in the second frame 316, and the second mutual sensing scan 308 in the second frame 316.

On the other hand, in certain embodiments, the coordinates of a user touch in each frame may be determined by taking the average of both the mutual sensing scans in a single frame. For example, the coordinates of a user touch the second frame 316 may be determined by taking the average of the mutual sensing values detected by the first mutual sensing scan 307 in the second frame 316, and the second mutual sensing scan 308 in the second frame 316.

Next, at a third frame 326, the current frame count is now two. The modulus between two and two is equal to zero. Therefore, the first sequence of scans may be reused.

Therefore, the sequence of the scans in the third frame 326 may be as follows: a self-sensing scan 306, a third noise sampling scan 328, a first mutual sensing scan 307, and then a second mutual sensing scan 308.

Because FIG. 3A illustrates a two frame rotation, in the third frame 326, the third noise sampling scan 328 may be performed at the first time location 312 to determine a third frequency. The third frequency may be the same or different than the first frequency depending on the frame of the image displayed in the third frame. Then in the same manner described above, a first mutual sensing scan 307 and a second mutual sensing scan 308 may be performed in the third frame 326 at the third frequency. In embodiments where more than two frames (scan sequences) are used, the third noise sampling scan 328 may be performed at a location different than the first time location 312 and the second time location 324. This will be shown in detail below.

Then, based on the mutual sensing values collected, coordinates of a touch by a user in the third frame 326 may be determined based on a rolling average of all the mutual sensing values collected in each previous frame, or an average of the mutual sensing data collected by mutual sensing scans in the third frame.

Alternatively, the frequency determined by a noise sampling scan in a previous frame may be used as the frequency of a mutual sensing scan in the subsequent frame. For example, the first mutual sensing scan 307 and the second mutual sensing scan 308 in the second frame 316 may be performed at the first frequency. The first mutual sensing scan 307 and the second mutual sensing scan 308 in the third frame 326 may be performed at the second frequency and so on.

In some embodiments, the frequencies used for mutual sensing scans may be determined based on rolling average of the noise values determined for each of the plurality of frequencies in each frame. For example, the noise values determined for the different frequencies determined during the second noise sampling scan 320 may be averaged with the noise values determined for the different frequencies determined during the first noise sampling scan 304. The frequency having the lowest average noise value may be used as the second frequency. This may be repeated for each of the frames. For example, the third frequency may be determined based on the average noise levels for each frequency determined in the first noise sampling scan 304, the second noise sampling scan 320, and the third noise sampling scan 328.

Referring to FIG. 3B, readout 334 may be generated by the touchscreen controller 104 when a zebra image is being displayed and a touch is not occurring on the display 102. Advantageously, as shown in readout 334, the mutual sensing values are close to zero and a ghost touch will not be reported to the system on a chip 106.

Figure 4:
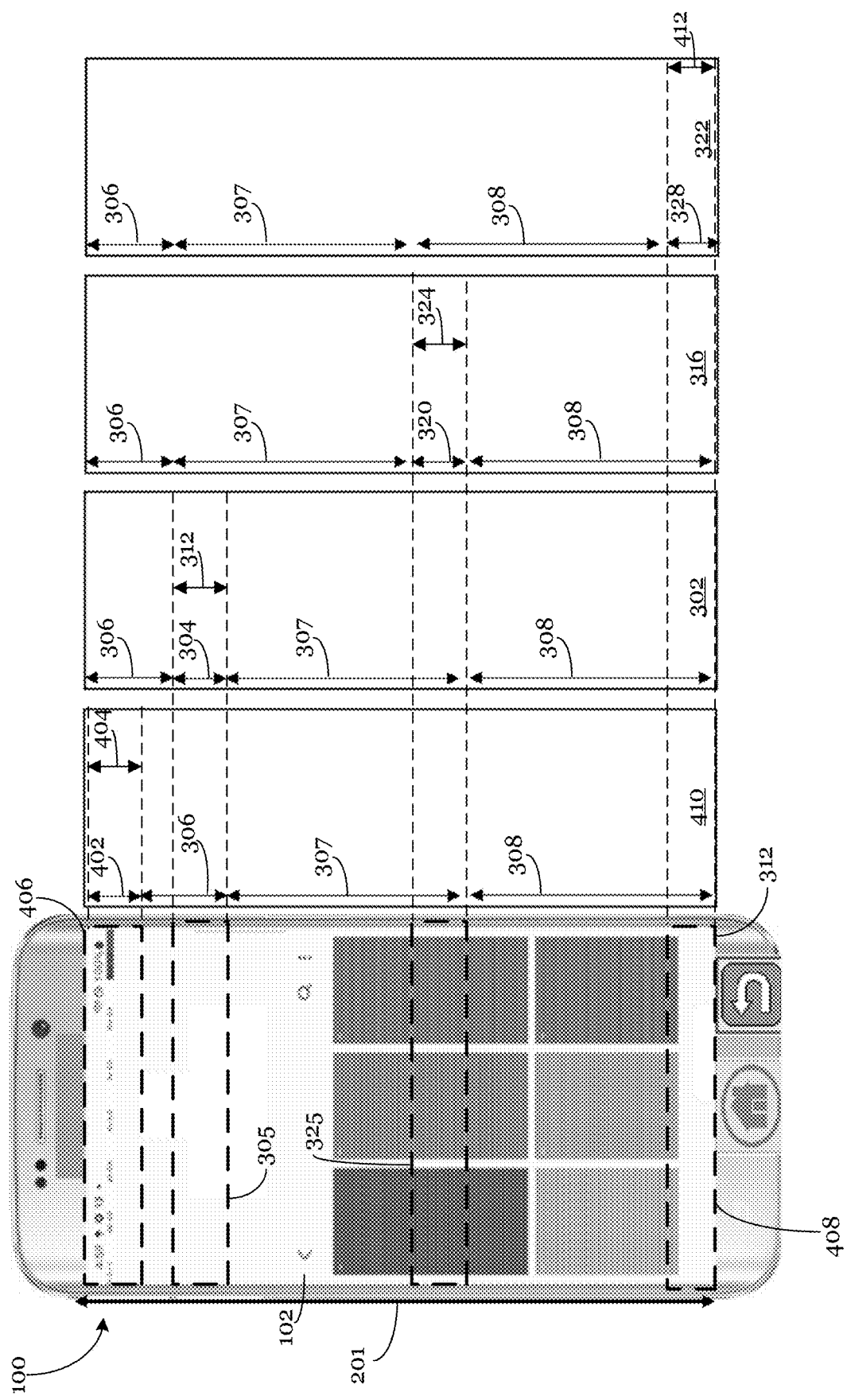
FIG. 4 illustrates schematic views of an electronic device preventing ghost touches using four different rotating sequences of sensing scans.

FIG. 4 illustrates schematic views of an electronic device preventing ghost touches using four different rotating sequences of sensing scans.

Referring to FIG. 4, four sequences of scans may be rotated between four different frames. In other words, a fourth frame 410 may occur before the first frame 302.

In a first sequence, defined as order zero, the sequence of scans may be as follows: a noise sampling scan, a self-sensing scan, a first mutual sensing scan, and then a second mutual sensing scan. In a second sequence, defined as order one, the sequence of scans may be as follows: a self-sensing scan, a noise sampling scan, a first mutual sensing scan, and then a second mutual sensing scan. In a third sequence, defined as order two, the sequence of scans may be as follows: a self-sensing scan, a first mutual sensing scan, a noise sampling scan and then a second mutual sensing scan. In a fourth sequence, defined as order three, the sequence of scans may be as follows: a self-sensing scan, a first mutual sensing scan, a second mutual sensing scan, and then a noise sampling scan.

Referring back to FIG. 4, at the fourth frame 410, the current frame count is equal to zero. Therefore, the first sequence of scans is used. Therefore, the order of scans in the fourth frame 410 is as follows: a fourth noise sampling scan 402, a self-sensing scan 306, a first mutual sensing scan 307, and a second mutual sensing scan 308.

The fourth noise sampling scan 402 may be performed over a fourth time location 404 and cover a fourth portion 406 of the display 102 to determine a fourth frequency in the same manner described above. In various embodiments, each mutual sensing scan that is performed between noise sampling scans may be performed at the previous determined frequency. Therefore, the first mutual sensing scan 307 and the second mutual sensing scan 308 in the fourth frame 410 may be performed at the fourth frequency.

At the first frame 302, the current frame count is one, therefore the order number used is one. Therefore, the second sequence of scans is used. Therefore, the order of scans in the first frame 302 is as follows: a self-sensing scan 306, the first noise sampling scan 304, a first mutual sensing scan 307, and then a second mutual sensing scan 308.

The first noise sampling scan 304 may be performed over the first time location 312 and cover the first portion 305 of the display 102 to determine a first frequency in the same manner described above. Because the first noise sampling scan is performed prior to the mutual sensing scans in the first frame 302, the first mutual sensing scan 307 and the second mutual sensing scan 308 in the first frame 302 may be performed at the first frequency.

On the other hand, as described above, the noise levels determined during the fourth noise sampling scan 402, and the first noise sampling scan 304 may be averaged. Then the first frequency may be determined based on the frequency having the lowest average noise levels.

Alternatively, as described above, the first mutual sensing scan 307 and the second mutual sensing scan 308 in the first frame 302 may be performed at the fourth frequency.

At the second frame 316, the current frame count is two, therefore, the current order number used is two. Therefore, the third sequence of scans is used. Therefore, the order of the scans in the second frame 316 is as follows: a self-sensing scan 306, a first mutual sensing scan 307, the second noise sampling scan 320, and then a second mutual sensing scan 308.

The second noise sampling scan 320 may be performed over the second time location 324 to determine a second frequency in the same manner discussed above. Alternatively, the second frequency may be determined based on the average noise levels for the different frequencies determined from the fourth noise sampling scan 402, the first noise sampling scan 304, and the second noise sampling scan 320.

As described above, because the first mutual sensing scan 307 in the second frame occurs prior to the second noise sampling scan, the first mutual sensing scan 307 may be performed at the first frequency and the second mutual sensing scan 308 may be performed at the second frequency. Alternatively, both mutual sensing scans in the second frame 316 may be performed at the first frequency.

At the third frame 322, the current frame count is three, therefore, the current order number used is three. Therefore, the fourth sequence of scans is used. Therefore, the order of the scans in the third frame 322 is as follows: a self-sensing scan 306, a first mutual sensing scan 307, a second mutual sensing scan 308, and then a third noise sampling scan 328.

The third noise sampling scan 328 may be performed over a third time location 412 to determine a third frequency in the same manner discussed above. Here, because the third noise sampling scan 328 is performed at a third time location 412 instead of the first time location 312, like in FIG. 3A, the third noise sampling scan may cover a third portion 408 of the display instead of the first portion 305. This advantageously allows for even better coverage of noise sampling scans across the display 102.

Alternatively, the third frequency may be determined based on the average noise levels for the different frequencies determined from the fourth noise sampling scan 402, the first noise sampling scan 304, the second noise sampling scan 320, and the third noise sampling scan 328.

Because the first mutual sensing scan 307 and the second mutual sensing scan 308 in the third frame 322 are performed prior to the third noise sampling scan 328, they may both be performed at the second frequency.

However, in embodiments, in which the frequency used from the previous frame is used in the next frame, a fifth frame occurring after the third frame 322 would follow the first scan sequence and use the third frequency for both mutual sensing scans.

Although FIG. 3A illustrates a two sequence rotation and FIG. 4 illustrates a four frame rotation, this is for example purposes only. Any suitable number of sequences may be used, for example, a three sequence rotation or a five sequence rotation.

Figure 5:
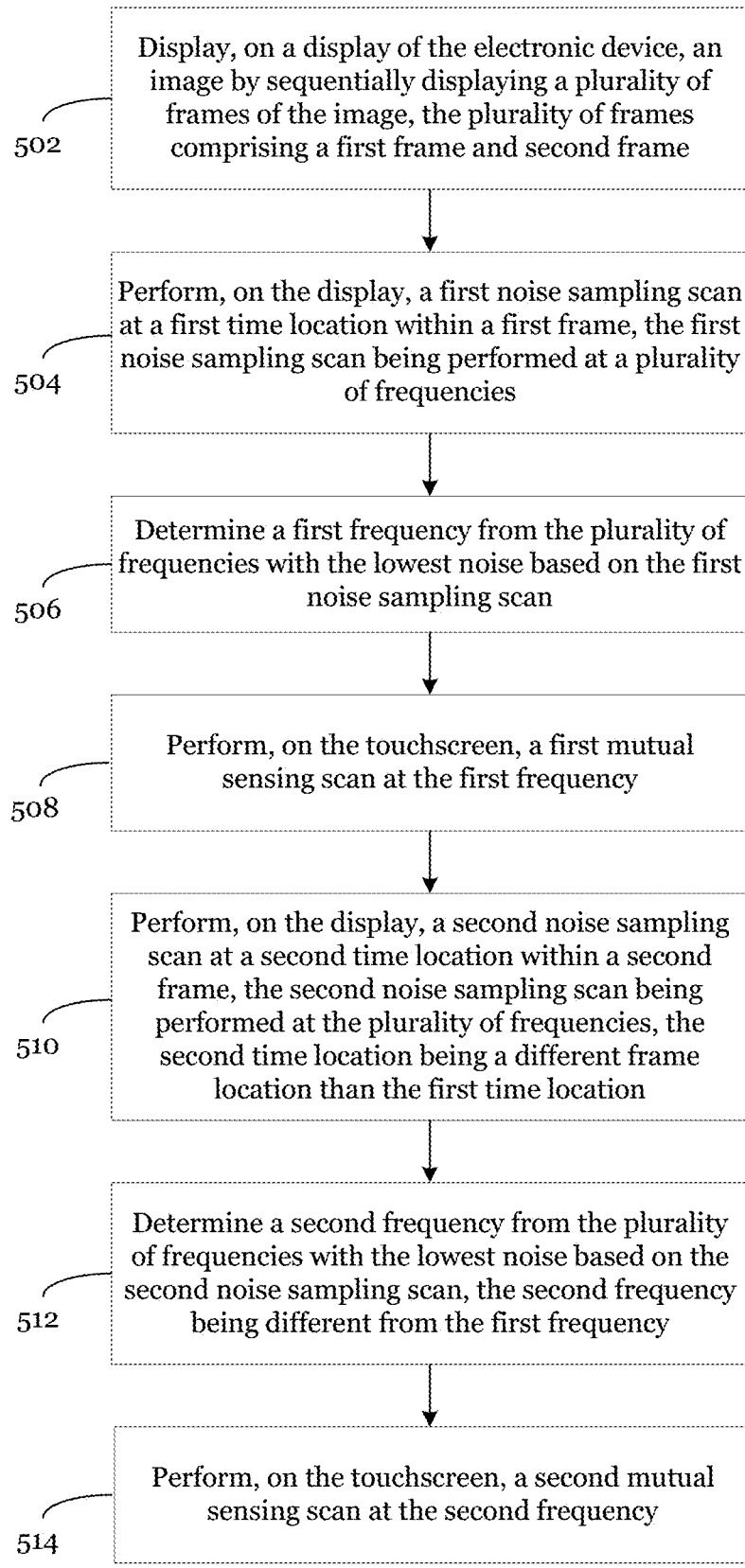
FIG. 5 illustrates a process flow for preventing ghost touches according to an embodiment of the present application.

FIG. 5 illustrates a process flow for preventing ghost touches according to an embodiment of the present application.

Referring to block 502, and described with reference to FIG. 1A, an image may be displayed on a display 102 of an electronic device 100. In various embodiments, the image may be a media such as a video displayed over a plurality of frames or simply a single image which is continuously refreshed over a plurality of frames. The frame of the image displayed in each of the plurality of frames may be updated (refreshed) according to a vertical synchronization signal (Hsync) and a vertical synchronization signal (Vsync) in the same manner described above.

As next illustrated in block 504, and described with reference to FIGS. 3A and 4, a first noise sampling scan 304 is performed at a first time location 312 within a first frame 302. The first noise sampling scan 304 may be performed at a plurality of frequencies in the same manner described above.

As next illustrated in block 506, and described with reference to FIGS. 3A and 4, a first frequency is determined as the frequency from the plurality of frequencies with the lowest noise based on the first noise sampling scan 304.

As next illustrated in block 508, and described with reference to FIGS. 3A and 4, a first mutual sensing scan may be performed, on the touchscreen 118 of the electronic device 100, at the first frequency. For example, referring to both FIGS. 3A and 4, in the first frame 302, a first mutual sensing scan 307 in the first frame 302 may be performed at the first frequency.

Also, as described above, because a first mutual sensing scan 307 in the second frame 316 is performed prior to a second noise sampling scan 320, a first mutual sensing scan 307 may be performed in the second frame 316 at the first frequency.

In various embodiments, after performing both mutual sensing scans in the first frame 302, coordinates of a touch on the touchscreen 118 may be determined based on an average of the mutual sensing values determined in the first mutual sensing scan 307 and the second mutual sensing scan 308 performed in the first frame 302.

As next illustrated in block 510, and described with reference to FIGS. 3A and 4, a second noise sampling scan 320 may be performed at a second time location 324 within a second frame 316 to determine a second frequency. As described above the second noise sampling scan 320 may be performed at the same plurality of frequencies used in the first noise sampling scan 304. Advantageously, the scans performed in the second frame 316 may be performed in a different sequence than the scans performed in the first frame 302. Therefore, the second time location 324 is different than the first time location 312. Advantageously, this allows for better coverage of noise sampling scans performed on the display 102.

As next illustrated in block 512, and described with reference to FIGS. 3A and 4 a second frequency from the plurality of frequencies with the lowest noise based on the second noise sampling scan 320 may be determined.

The second frequency may be the frequency of the plurality of frequencies with the lowest noise value. On the other hand, the noise values may be determined based on rolling averages of the noise levels for each of the plurality of frequencies in each noise sampling scan.

For example in the two sequence rotation example in FIG. 3A, the noise values determined in the second noise sampling scan 320 and the first noise sampling scan 304 may be averaged. The frequency of the plurality of frequencies with the lowest average may be used as the second frequency.

As another example, in the four sequence rotation example in FIG. 4, the noise values determined in the fourth noise sampling scan 402, the second noise sampling scan 320, and the first noise sampling scan 304 may be averaged. The frequency of the plurality of frequencies with the lowest average may be used as the second frequency.

As next illustrated in block 514, and described with reference to FIGS. 3A and 4, a second mutual sensing scan may be performed at the second frequency. In the second frame 316, because the second mutual sensing scan 308 occurs after the second noise sampling scan 320, the second mutual sensing scan 308 may be performed at the second frequency. Advantageously, frequency hopping may be performed within a frame. In other words, because the first mutual sensing scan 307 is performed before the second noise sampling scan 320, frequency hopping may be performed within the second frame 316.

In various embodiments, the mutual sensing values determined in each mutual sensing scan in each may be used to determine coordinates of touch on the touchscreen in each corresponding frame. For example, in the second frame 316 the first mutual sensing scan 307 and the second mutual sensing scan 308 may be averaged to determine the touch coordinates.

On the other hand a rolling average of mutual sensing scans may be used to determine touch coordinates in each frame. For example in the two sequence rotation example in FIG. 3A, the touch coordinates in the second frame 316 may be determined based on the average between mutual sensing values determined in the first mutual sensing scan 307 in the first frame 302, the second mutual sensing scan 308 in the first frame 302, the first mutual sensing scan 307 in the second frame 316, and the second mutual sensing scan 308 in the second frame 316. This may be applied to each of the plurality of frames.

Also, in the four sequence rotation example in FIG. 4, the touch coordinates of the second frame 316 may be determined by the average of the mutual sensing values determined in the first mutual sensing scan 307 in the fourth frame 410, the second mutual sensing scan 308 in the fourth frame 410, the first mutual sensing scan 307 in the first frame 302, the second mutual sensing scan 308 in the first frame 302, the first mutual sensing scan 307 in the second frame 316, and the second mutual sensing scan 308 in the second frame 316.

Example embodiments of the invention are summarized here. Other embodiments can also be understood from the entirety of the specification as well as the claims filed herein.

Example 1. A method for operating an electronic device, the method including: displaying, on a display of the electronic device, an image by sequentially displaying a plurality of frames of the image, the plurality of frames including a first frame and second frame; performing, on the display, a first noise sampling scan at a first time location within a first frame of the plurality of frames, the first noise sampling scan being performed at a plurality of frequencies; determining a first frequency from the plurality of frequencies with the lowest noise based on the first noise sampling scan; performing, on a touchscreen of the electronic device, a first mutual sensing scan at the first frequency; performing, on the display, a second noise sampling scan at a second time location within a second frame of the plurality of frames, the second noise sampling scan being performed at the plurality of frequencies, the second time location being a different frame location than the first time location; determining a second frequency from the plurality of frequencies with the lowest noise based on the second noise sampling scan, the second frequency being different from the first frequency; and performing, on the touchscreen, a second mutual sensing scan at the second frequency.

Example 2. The method of example 1, further including: performing a third noise sampling scan at a third time location within a third frame, the third noise sampling scan being performed at the plurality of frequencies, the third time location being a different frame location than the first and the second time locations; performing a third mutual sensing scan at a third frequency of the plurality of frequencies based on the third noise sampling scan; performing a fourth noise sampling scan at a fourth time location within a fourth frame, the fourth noise sampling scan being performed at the plurality of frequencies, the fourth time location being a different frame location than the first, the second, and the third time locations; and performing a fourth mutual sensing scan at a fourth frequency of the plurality of frequencies based on the fourth noise sampling scan.

Example 3. The method of one of examples 1 or 2, further including: performing a third noise sampling scan at the first time location within a third frame; and performing a third mutual sensing scan at the first frequency based on the third noise sampling scan.

Example 4. The method of one of examples 1 to 3, where the first mutual sensing scan is performed within the first frame, and where the second mutual sensing scan is performed within the second frame.

Example 5. The method of one of examples 1 to 4, where the values from the first mutual sensing scan and the second mutual sensing scan are included to obtain an average mutual sense value for the touchscreen at the second frame, further including: detecting a touch of the touchscreen during the second frame based on the average mutual sense value.

Example 6. The method of one of examples 1 to 5, where the first mutual sensing scan is performed within a first portion of the second frame and the second mutual sensing scan are performed within a second portion of the second frame.

Example 7. The method of one of examples 1 to 6, where the values from the first mutual sensing scan and the second mutual sensing scan are included to obtain an average mutual sense value for the touchscreen at the second frame, further including: detecting a touch of the touchscreen during the second frame based on the average mutual sense value.

Example 8. The method of one of examples 1 to 7, further including: detecting a touch of the touchscreen during the second frame based on a mutual sense value obtained from the second mutual sensing scan.

Example 9. The method of one of examples 1 to 8, performing the first noise sampling scan includes: sampling pixels of a portion of the display at the plurality of frequencies to determine a noise level for each sampling frequency.

Example 10. A device including: a display including a display layer including a plurality of pixels; a touchscreen including a touchscreen controller; and a non-transitory memory storing instructions to be executed in the touchscreen controller to configure the touchscreen controller to execute the example of claim 1.

Example 11. A method for operating an electronic device, the method including: displaying, on a display layer of a touchscreen, an image by sequentially displaying a plurality of frames of the image; performing, by a touchscreen controller, a plurality of scans on the touchscreen in each of the plurality of frames, each of the plurality of scans including a noise sampling scan performed on the display layer and a mutual sensing scan performed on a touch sensing layer of the touchscreen; determining, in each of the plurality of frames, a first frequency for a subsequent mutual-sensing scan from a plurality of sampling frequencies based on noise levels determined during a previous noise sampling scan; performing the subsequent mutual sensing scan at the first frequency; and changing a sequence of each of the plurality of scans after each of the plurality of frames.

Example 12. The method of example 11, where the noise sampling scan is performed over a different portion of the display layer in consecutive frames.

Example 13. The method of one of examples 11 or 12, where performing a noise sampling scan includes: sampling capacitances of pixels of a portion of the display layer, where sub-portions of the portion of the display layer are each sampled at a different sampling frequency; and determining a noise level for each sampling frequency based on the capacitances sampled in each corresponding sub-portion.

Example 14. The method of one of examples 11 to 13, where the plurality of scans further includes a self-sensing scan and a further mutual sensing scan.

Example 15. The method of one of examples 11 to 14, where determining the first frequency includes: determining a noise level for each of the plurality of sampling frequencies used during the previous noise sampling scan; and determining a sampling frequency having the lowest noise level to be the first frequency.

Example 16. The method of one of examples 11 to 15, where the plurality of scans further includes a further mutual sensing scan, and where mutual sensing touch values determined by the mutual sensing scan and the further mutual sensing scan in each frame are averaged.

Example 17. The method of one of examples 11 to 16, where determining the first frequency includes: determining an average noise level for each of the plurality of sampling frequencies in four preceding frames, the average noise levels being determined during noise sampling scans performed in each of the four preceding frames; and determining a sampling frequency having the lowest average noise level to be the first frequency.

Example 18. A device including: a display including a display layer including a plurality of pixels; a touchscreen including a touchscreen controller; and a non-transitory memory storing instructions to be executed in the touchscreen controller to configure the touchscreen controller to execute the method of example 11.

Example 19. A method for operating a touchscreen, the method including: displaying, on a display layer of a touchscreen, an image by sequentially displaying a plurality of frames of the image; performing, by a touchscreen controller, a plurality of scans on the touchscreen in each of the plurality of frames, each of the plurality of scans including a noise sampling scan performed on the display layer and a mutual sensing scan performed on a touch sensing layer of the touchscreen, the noise sampling scan being performed at a plurality of different noise sampling frequencies, and a start time of the noise sampling scan in each of the plurality of frames being determined based on a frame count of the frame being displayed within the plurality of frames; determining, based on the noise sampling scan for each frame, a noise sampling frequency from amongst the plurality of different noise sampling frequencies having a lowest noise level for that frame; and performing, a mutual sensing scan that is performed subsequent to the noise sampling scan at the noise sampling frequency having the lowest noise level.

Example 20. The method of example 19, where the plurality of scans further includes a further mutual sensing scan, and where mutual sensing touch values determined by the mutual sensing scan and the further mutual sensing scan in each frame are averaged.

Example 21. The method of one of examples 19 or 20, where determining the noise sampling frequency includes: determining an average noise level for each of the plurality of different noise sampling frequencies in four preceding frames, the average noise levels being determined during noise sampling scans performed in each of the four preceding frames; and determining a sampling frequency having the lowest average noise level to be the noise sampling frequency.

Example 22. The method of one of examples 19 to 21, where determining the noise sampling frequency includes: sampling capacitances of pixels of a portion of the display layer of the touchscreen, where sub-portions of the portion of the display layer are each sampled at a different sampling frequency; determining a noise level for each sampling frequency based on the capacitances sampled in each corresponding sub-portion; and determining the sampling frequency having the lowest noise level.

Example 23. A device including: a display including a display layer including a plurality of pixels; a touchscreen including a touchscreen controller; and a non-transitory memory storing instructions to be executed in the touchscreen controller to configure the touchscreen controller to execute the method of example 19.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
    a display comprising a display layer comprising a plurality of pixels;
    a touchscreen comprising a touchscreen controller; and
    a non-transitory memory storing a program to be executed in the touchscreen controller, the program comprising instructions to
        render, on the display, an image by sequentially displaying a plurality of frames of the image, the plurality of frames comprising a first frame and a second frame;
        rotate a start time of noise sampling scans over a sequence of rotating time locations within a duration of the plurality of frames so as to perform the noise sampling scans over different portions of the display layer in consecutive frames, each of the different portions being a region of the display layer smaller than all of the display layer;
        perform, on the display, a first noise sampling scan at a first time location within a first frame of the plurality of frames, the first noise sampling scan being performed at a plurality of frequencies;
        determine a first frequency from the plurality of frequencies with the lowest noise based on the first noise sampling scan;
        perform, on the touchscreen a first mutual sensing scan at the first frequency;
        perform, on the display, a second noise sampling scan at a second time location within the second frame of the plurality of frames and within the duration of the second frame, the second noise sampling scan being performed at the plurality of frequencies, the second time location within the duration of the second frame being a different frame location than the first time location within the duration of the first frame;
        determine, based on the second noise sampling scan, a second frequency from the plurality of frequencies with the lowest noise, the second frequency being different from the first frequency; and
        perform, on the touchscreen, a second mutual sensing scan at the second frequency.

2. The device of claim 1, wherein the program comprises further instructions to
    perform a third noise sampling scan at a third time location within a third frame, the third noise sampling scan being performed at the plurality of frequencies, the third time location being a different frame location than the first and the second time locations;
    perform a third mutual sensing scan at a third frequency of the plurality of frequencies based on the third noise sampling scan;
    perform a fourth noise sampling scan at a fourth time location within a fourth frame, the fourth noise sampling scan being performed at the plurality of frequencies, the fourth time location being a different frame location than the first, the second, and the third time locations; and perform a fourth mutual sensing scan at a fourth frequency of the plurality of frequencies based on the fourth noise sampling scan.

3. The device of claim 1, wherein the program comprises further instructions to perform a third noise sampling scan at the first time location within a third frame; and perform a third mutual sensing scan at the first frequency based on the third noise sampling scan.

4. The device of claim 1, wherein the first mutual sensing scan is performed within the first frame, and wherein the second mutual sensing scan is performed within the second frame.

5. The device of claim 4, wherein the values from the first mutual sensing scan and the second mutual sensing scan are included to obtain an average mutual sense value for the touchscreen at the second frame, further comprising:

detecting a touch of the touchscreen during the second frame based on the average mutual sense value.

6. The device of claim 1, wherein the first mutual sensing scan is performed within a first portion of the second frame and the second mutual sensing scan are performed within a second portion of the second frame.

7. The device of claim 6, wherein the values from the first mutual sensing scan and the second mutual sensing scan are included to obtain an average mutual sense value for the touchscreen at the second frame, further comprising:

detecting a touch of the touchscreen during the second frame based on the average mutual sense value.

8. The device of claim 1, wherein the program comprises further instructions to detect a touch of the touchscreen during the second frame based on a mutual sense value obtained from the second mutual sensing scan.

9. The device of claim 1, wherein instructions to perform the first noise sampling scan comprise instructions to sample capacitances of pixels of a portion of the display, wherein sub-portions of the portion of the display are each sampled at a different frequency to determine a noise level for each sampling frequency based on the capacitances sampled in each corresponding sub-portion.

10. A device comprising:

a display comprising a display layer comprising a plurality of pixels;

a touchscreen comprising a touchscreen controller; and a non-transitory memory storing a program to be executed in the touchscreen controller, the program comprising instructions to render, on the display layer, an image by sequentially displaying a plurality of frames of the image;

perform, by the touchscreen controller, a plurality of scans on the touchscreen in each of the plurality of frames, each of the plurality of scans including a noise sampling scan performed on the display layer and a mutual sensing scan performed on a touch sensing layer of the touchscreen, wherein instructions to perform a noise sampling scan comprise instructions to sample capacitances of pixels of a portion of the display layer, wherein sub-portions of the portion of the display layer are each sampled at a different sampling frequency, and determining a noise level for each sampling frequency based on the capacitances sampled in each corresponding sub-portion;

determine, in each of the plurality of frames, a first frequency for a subsequent mutual-sensing scan from a plurality of sampling frequencies based on noise levels determined during a previous noise sampling scan;

perform the subsequent mutual sensing scan at the first frequency; and change a sequence of each of the plurality of scans after each of the plurality of frames.

11. The device of claim 10, wherein the noise sampling scan is performed over a different portion of the display layer in consecutive frames.

12. The device of claim 10, wherein the instructions to perform the noise sampling scan comprise instructions to:

sample capacitances of pixels of a portion of the display layer, wherein sub-portions of the portion of the display layer are each sampled at a different sampling frequency; and determine a noise level for each sampling frequency based on the capacitances sampled in each corresponding sub-portion.

13. The device of claim 10, wherein the plurality of scans further includes a self-sensing scan and a further mutual sensing scan.

14. The device of claim 10, wherein the instructions to determine the first frequency comprise instructions to determine a noise level for each of the plurality of sampling frequencies used during the previous noise sampling scan; and determine a sampling frequency having the lowest noise level to be the first frequency.

15. The device of claim 10, wherein the plurality of scans further includes a further mutual sensing scan, and wherein mutual sensing touch values determined by the mutual sensing scan and the further mutual sensing scan in each frame are averaged.

16. The device of claim 10, wherein the instructions to determine the first frequency comprises instructions to:

determine an average noise level for each of the plurality of sampling frequencies in four preceding frames, the average noise levels being determined during noise sampling scans performed in each of the four preceding frames; and determine a sampling frequency having the lowest average noise level to be the first frequency.

17. A device comprising:

a display comprising a display layer comprising a plurality of pixels;

a touchscreen comprising a touchscreen controller; and a non-transitory memory storing a program to be executed in the touchscreen controller, the program comprising instructions to render, on the display layer, an image by sequentially displaying a plurality of frames of the image;

perform, by the touchscreen controller, a plurality of scans on the touchscreen in each of the plurality of frames, each of the plurality of scans including a noise sampling scan performed on the display layer and a mutual sensing scan performed on a touch sensing layer of the touchscreen, the noise sampling scan being performed at a plurality of different noise sampling frequencies, and a start time of the noise sampling scan in each of the plurality of frames being determined based on a frame count of the frame being displayed within the plurality of frames;

determine, based on the noise sampling scan for each frame, a noise sampling frequency from amongst the plurality of different noise sampling frequencies having a lowest noise level for that frame; and perform a mutual sensing scan that is performed subsequent to the noise sampling scan at the noise sampling frequency having the lowest noise level.

18. The device of claim 17, wherein the instructions to determine the noise sampling frequency comprises instructions to:

determine an average noise level for each of the plurality of different noise sampling frequencies in four preceding frames, the average noise levels being determined during noise sampling scans performed in each of the four preceding frames; and determine a sampling frequency having the lowest average noise level to be the noise sampling frequency.

19. The device of claim 17, wherein the plurality of scans further includes a further mutual sensing scan, and wherein mutual sensing touch values determined by the mutual sensing scan and the further mutual sensing scan in each frame are averaged.

20. The device of claim 17, wherein the instructions to determine the noise sampling frequency comprises instructions to:

sample capacitances of pixels of a portion of the display layer of the touchscreen, wherein sub-portions of the portion of the display layer are each sampled at a different sampling frequency;

determine a noise level for each sampling frequency based on the capacitances sampled in each corresponding sub-portion; and determine the sampling frequency having the lowest noise level.

* * * * *